(12) United States Patent
Fisher et al.

(10) Patent No.: US 7,015,124 B1
(45) Date of Patent: Mar. 21, 2006

(54) USE OF AMORPHOUS CARBON FOR GATE PATTERNING

(75) Inventors: Philip A. Fisher, Foster City, CA (US); Richard J. Huang, Cupertino, CA (US); Cyrus E. Tabery, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 177 days.

(21) Appl. No.: 10/424,420

(22) Filed: Apr. 28, 2003

(51) Int. Cl.
*H01L 21/3205* (2006.01)
*H01L 21/4763* (2006.01)

(52) U.S. Cl. .................................................... 438/586
(58) Field of Classification Search ................ 438/586
See application file for complete search history.

(56) References Cited

U.S. PATENT DOCUMENTS

| | | | |
|---|---|---|---|
| 4,382,100 A | | 5/1983 | Holland |
| 5,102,498 A | * | 4/1992 | Itoh et al. ................... 216/47 |
| 5,185,293 A | | 2/1993 | Franke et al. ............. 438/606 |
| 5,378,316 A | * | 1/1995 | Franke et al. ................ 216/2 |
| 5,385,762 A | | 1/1995 | Prins |
| 5,656,128 A | * | 8/1997 | Hashimoto et al. .......... 216/47 |
| 5,679,608 A | | 10/1997 | Cheung et al. |
| 5,721,090 A | | 2/1998 | Okamoto et al. |
| 5,759,746 A | | 6/1998 | Azuma et al. ............. 430/313 |
| 5,776,602 A | | 7/1998 | Ueda et al. |
| 5,837,357 A | | 11/1998 | Matsuo et al. |
| 5,891,575 A | | 4/1999 | Marchywka et al. |
| 5,965,934 A | * | 10/1999 | Cheung et al. ............ 257/642 |
| 5,981,398 A | | 11/1999 | Tsai et al. |
| 6,030,541 A | | 2/2000 | Adkisson et al. |
| 6,121,158 A | | 9/2000 | Benchikha et al. |

(Continued)

OTHER PUBLICATIONS

U.S. Appl. No. 10/215,173, entitled "Use of Amorphous Carbon Hard Mask for Gate Patterning to Eliminate Requirement of Poly Re–Oxidation", as filed on Aug. 8, 2002, including claims, drawings, and abstract (29 pages).

U.S. Appl. No. 10/277,760, entitled "Sacrificial Air Gap Layer for Insulation of Metals", as filed on Aug. 8, 2002, including claims, drawings, and abstract (17 pages).

U.S. Appl. No. 10/244,650, entitled "Use of Multilayer Amorphous Carbon Arc Stack to Eliminate Line Warpage Phenomenon", as filed on Sep. 16, 2002, including claims, drawings, and abstract (30 pages).

U.S. Appl. No. 10/217,730, entitled "Ion Implantation to Modulate Amorphous Carbon Stress", as filed on Aug. 13, 2002, including claims, drawings, and abstract (29 pages).

U.S. Appl. No. 10/230,794, entitled "Formation of Amorphous Carbon Arc Stack Having Graded Transition Between Amorphous Carbon and Arc Material", as filed on Aug. 29, 2002, including claims, drawings, and abstract (29 pages).

U.S. Appl. No. 10/230,775, entitled "Use of Buffer Dielectric Layer with Amorphous Carbon Mask to Reduce Line Warpage", as filed on Aug. 29, 2002, including claims, drawings, and abstract (28 pages).

(Continued)

*Primary Examiner*—George Fourson
*Assistant Examiner*—Fernando L. Toledo
(74) *Attorney, Agent, or Firm*—Foley & Lardner LLP

(57) ABSTRACT

A method of producing an integrated circuit includes providing a mask definition structure above a layer of conductive material and providing a mask above the layer of conductive material and in contact with at least a portion of the mask definition structure. The mask definition structure comprises a first material and the mask comprises a second material, wherein at least one of the first and second materials comprises amorphous carbon. The mask definition structure is removed, and the layer of conductive material is patterned according to the mask.

26 Claims, 4 Drawing Sheets

U.S. PATENT DOCUMENTS

| | | | |
|---|---|---|---|
| 6,140,200 A | 10/2000 | Eldridge | 438/396 |
| 6,171,343 B1 | 1/2001 | Dearnaley et al. | |
| 6,342,410 B1 * | 1/2002 | Yu | 438/164 |
| 6,350,390 B1 | 2/2002 | Liu et al. | |
| 6,365,320 B1 | 4/2002 | Foote et al. | |
| 6,368,924 B1 | 4/2002 | Mancini et al. | 438/286 |
| 6,372,628 B1 * | 4/2002 | Matsubara et al. | 438/622 |
| 6,388,924 B1 | 5/2002 | Nasu | 365/189.06 |
| 6,413,852 B1 | 7/2002 | Grill et al. | 438/619 |
| 6,428,894 B1 | 8/2002 | Babich et al. | |
| 6,492,212 B1 * | 12/2002 | Ieong et al. | 438/157 |
| 6,500,756 B1 * | 12/2002 | Bell et al. | 438/639 |
| 6,562,665 B1 * | 5/2003 | Yu | 438/149 |
| 6,573,030 B1 | 6/2003 | Fairbairn et al. | |
| 6,596,553 B1 | 7/2003 | Lin et al. | |
| 6,605,509 B1 * | 8/2003 | Hsieh | 438/264 |
| 6,605,514 B1 * | 8/2003 | Tabery et al. | 438/303 |
| 6,673,684 B1 | 1/2004 | Huang et al. | |
| 6,750,127 B1 | 6/2004 | Chang et al. | |
| 2002/0173160 A1 * | 11/2002 | Keil et al. | 438/717 |
| 2003/0170985 A1 * | 9/2003 | Hwang et al. | 438/689 |
| 2003/0181056 A1 * | 9/2003 | Kumar et al. | 438/710 |
| 2003/0206434 A1 * | 11/2003 | Leuschner | 365/173 |

OTHER PUBLICATIONS

U.S. Appl. No. 10/335,726, entitled "Use of Diamond as a Hard Mask Material", as filed on Jan. 2, 2003, including claims, drawings, and abstract (26 pages).

U.S. Appl. No. 10/424,675, entitled "Selective Stress-Inducing Implant and Resulting Pattern Distortion in Amorphous Carbon Patterning", as filed on Apr. 28, 2003, including claims, drawings, and abstract (28 pages).

U.S. Appl. No. 10/445,129, entitled "Modified Film Stack and Patterning Strategy for Stress Compensation and Prevention of Pattern Distortion in Amorphous Carbon Gate Patterning", as filed on May 20, 2003, including claims, drawings, and abstract (29 pages).

Yamaguchi, A. et al., "Ar Ion Implantation into Resist For Etching Resistance Improvement", Proceedings of SPIE vol. 4345 (2001), pp. 655–664.

Borzenko, V. et al., "The Effect of Ion Implantation On Polymer Mask Resistance To Ion Beam Etching", Vacuum, 38, 1007 (1988), pp. 1007–1009.

Wolf, S., Tauber, R. N., "Silicon Processing For the VLSI Era", Lattice Press, Sunset Beach, CA; 1986; pp. 322, 384–385, 556–557.

R. Gago, et al., "Bonding and hardness in nonhydrogenated carbon films with moderate $sp^3$ content", Journal of Applied Physics, vol. 87, No. 11, Jun. 1, 2000, 7 pgs.

* cited by examiner

USE OF AMORPHOUS CARBON FOR GATE PATTERNING

CROSS-REFERENCE TO RELATED PATENT APPLICATIONS

This application is related to U.S. Patent Application No. 10/215,173 filed Aug. 8, 2002 and entitled "Use of Amorphous Carbon Hard Mask for Gate Patterning to Eliminate Requirement of Poly Re-Oxidation," U.S. Patent Application No. 10/277,760 filed Oct. 22, 2002 and entitled "Sacrificial Air Gap Layer for Insulation of Metals," U.S. Patent Application No. 10/244,650 filed Sept. 16, 2002 and entitled "Use of Multilayer Amorphous Carbon Hard Mask to Eliminate Line Warpage Phenomenon," U.S. Patent Application No. 10/217,730 filed Aug. 13, 2002 and entitled "Ion Implantation to Modulate Amorphous Carbon Stress," U.S. Patent Application No. 10/230,794 filed Aug. 29, 2002 and entitled "Formation of Amorphous Carbon ARC Stack Having Graded Transition Between Amorphous Carbon and ARC Material." U.S. Patent Application No. 60/399,768 filed Jul. 31, 2002 and U.S. Patent Application No. 10/335,726 filed Jan. 2, 2003, both of which are entitled "Use of Diamond as a Hard Mask Material," U.S. Patent Application No. 10/424,675 filed Apr. 28, 2003 and entitled "Selective Stress-Inducing Implant and Resulting Pattern Distortion in Amorphous Carbon Gate Patterning," and U.S. Patent Application No. 10/445,129 filed May 20, 2003 and entitled "Modified Film Stack and Patterning Strategy for Stress Compensation and Prevention of Pattern Distortion in Amorphous Carbon Gate Patterning," each of which is assigned to the assignee of the present application.

FIELD OF THE INVENTION

The present disclosure relates generally to the field of integrated circuits and methods of manufacturing integrated circuits. More particularly, the present disclosure relates to the use of amorphous carbon to form features in integrated circuits (ICs).

BACKGROUND OF THE INVENTION

Deep-submicron complementary metal oxide semiconductor (CMOS) is conventionally the primary technology for ultra-large scale integrated (ULSI) circuits. Over the last two decades, reduction in the size of CMOS transistors has been a principal focus of the microelectronics industry.

Transistors (e.g., MOSFETs), are often built on the top surface of a bulk substrate. The substrate is doped to form source and drain regions, and a conductive layer is provided between the source and drain regions. The conductive layer operates as a gate for the transistor; the gate controls current in a channel between the source and the drain regions.

Ultra-large-scale integrated (ULSI) circuits generally include a multitude of transistors, such as, more than one million transistors and even several million transistors that cooperate to perform various functions for an electronic component. The transistors are generally complementary metal oxide semiconductor field effect transistors (CMOSFETs) which include a gate conductor disposed between a source region and a drain region. The gate conductor is provided over a thin gate oxide material. Generally, the gate conductor can be a metal, a polysilicon, or polysilicon/germanium ($Si_xGe_{(1-x)}$) material that controls charge carriers in a channel region between the drain and the source to turn the transistor on and off. Conventional processes typically utilize polysilicon based gate conductors because metal gate conductors are difficult to etch, are less compatible with front-end processing, and have relatively low melting points. The transistors can be N-channel MOSFETs or P-channel MOSFETs.

Generally, it is desirable to manufacture smaller transistors to increase the component density on an integrated circuit. It is also desirable to reduce the size of integrated circuit structures, such as vias, conductive lines, capacitors, resistors, isolation structures, contacts, interconnects, etc. For example, manufacturing a transistor having a reduced gate length (a reduced width of the gate conductor) can have significant benefits. Gate conductors with reduced widths can be formed more closely together, thereby increasing the transistor density on the IC. Further, gate conductors with reduced widths allow smaller transistors to be designed, thereby increasing speed and reducing power requirements for the transistors.

As critical dimensions (CDs) of device structures are made smaller, certain issues must be addressed during processing. One such issue involves the use of a wet etch to remove mask layers used in the formation of the structures. When structures having small critical dimensions are produced, the introduction of phosphoric acid or other aqueous etchants to remove a mask layer may damage the structure formed during the etching process.

Another issue involves the ability to form masks at very small sizes (e.g., 60 nanometers or less). For example, where a mask is formed by depositing a layer of material and removing a portion of the layer of material, it is difficult to reliably achieve a mask shape that has the desired dimensions. For example, etchants used to form the mask may cause the mask to collapse.

Thus, there is a need to form structures in an integrated circuit using an improved method that produces structures having reduced critical dimensions. Further, there is a need to produce structures that have reduced critical dimensions without damaging the structures during etching or processing of other layers. Even further, there is a need to use amorphous carbon as a mask in the formation of integrated circuit structures. Even further still, there is a need to form masks for producing features having small critical dimensions that maintain a desired shape during processing.

SUMMARY OF THE INVENTION

An exemplary embodiment relates to a method of producing an integrated circuit. The method includes providing a mask definition structure above a layer of conductive material and providing a mask above the layer of conductive material and in contact with at least a portion of the mask definition structure. The method also includes removing the mask definition structure and patterning the layer of conductive material according to the mask. The mask definition structure comprises a first material, and the mask comprises a second material, and at least one of the first and second materials comprises amorphous carbon.

Another exemplary embodiment relates to a method of forming features in an integrated circuit. The method includes forming a mask support structure above a layer of polysilicon and depositing mask material adjacent to the mask support structure. The method also includes removing a portion of the mask material to form a mask. The mask abuts a portion of the mask support structure. The method further includes removing the mask support structure and etching the layer of polysilicon according to the mask. One of the mask support structure and the mask comprises amorphous carbon.

A further exemplary embodiment relates to an integrated circuit produced by a method that includes providing a first layer of material over a layer of conductive material and removing a portion of the first layer of material to form a mask definition feature. The method also includes providing a second layer of material over the layer of conductive material and adjacent to at least a portion of the mask definition feature and removing a portion of the second layer of material to form a mask. At least a portion of the mask is defined by the mask definition feature. The method further includes removing the mask definition feature and forming a feature in the layer of conductive material according to the mask. One of the first layer of material and the second layer of material comprises amorphous carbon.

Other principal features and advantages will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE PREFERRED EMBODIMENTS

Figure 1:
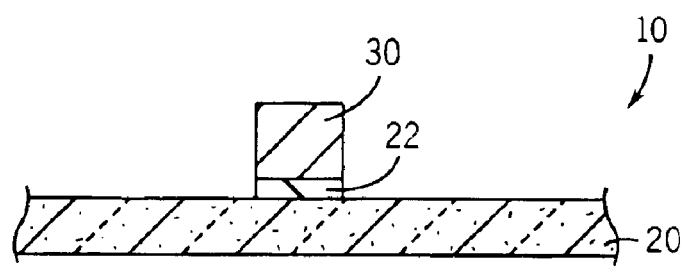
FIG. 1 is a schematic cross-sectional view of a portion of an integrated circuit fabricated in accordance with an exemplary embodiment.

Referring to FIG. 1, a portion 10 of an integrated circuit (IC) includes a substrate layer 20, an oxide or dielectric layer 22, and a line or gate conductor 30. Portion 10 is preferably part of an ultra-large-scale integrated (ULSI) circuit having a million or more transistors, and is manufactured as part of the IC on a wafer made of a semiconducting material (e.g., silicon, gallium arsenide, etc.).

Conductive line 30 can be a metal, a polysilicon, or polysilicon/germanium ($Si_xGe_{(1-x)}$) material that controls charge carriers in a channel region formed between source and drain regions in substrate 20 to turn the transistor on and off. Conductive line 30 may be doped or undoped. In an exemplary embodiment, conductive line 30 is made of a polysilicon material and has a thickness between approximately 1000 and 2000 angstroms (preferably between approximately 1,200 and 1,500 angstroms) and a width of between approximately 30 and 50 nanometers or less.

Figure 11:
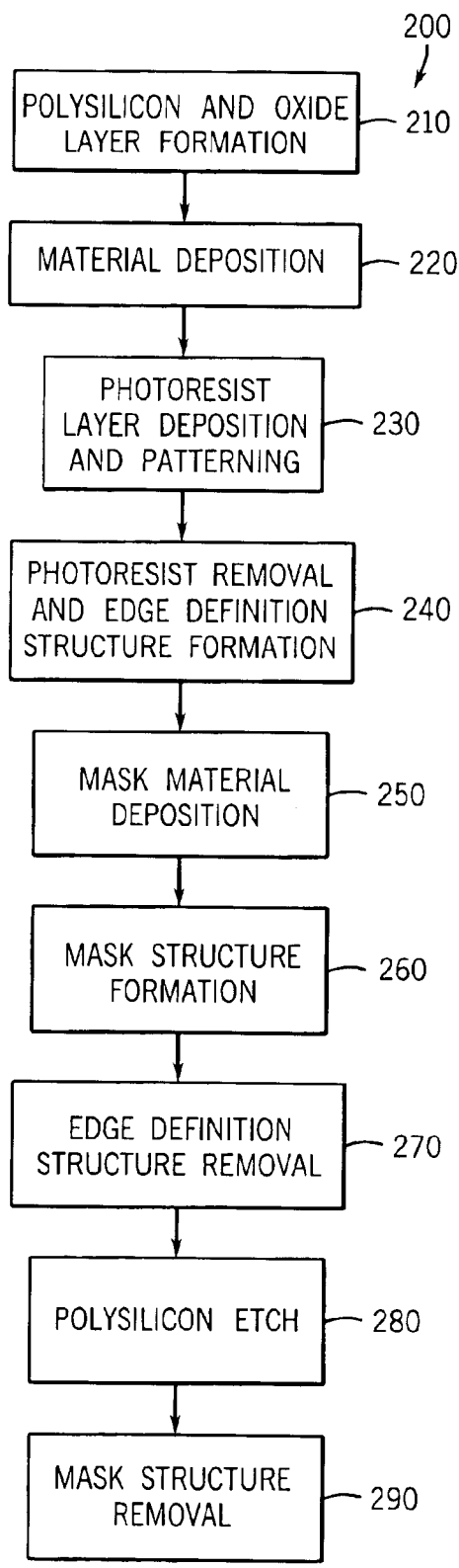
FIG. 11 is a flow diagram illustrating the process of forming structures in an integrated circuit according to the exemplary embodiment shown in FIGS. 2–6.

A method for producing or forming portion 10 will now be described with reference to FIGS. 2 to 6. FIG. 11 is a flow diagram that outlines a process 200 used in the formation of portion 10.

Figure 2:
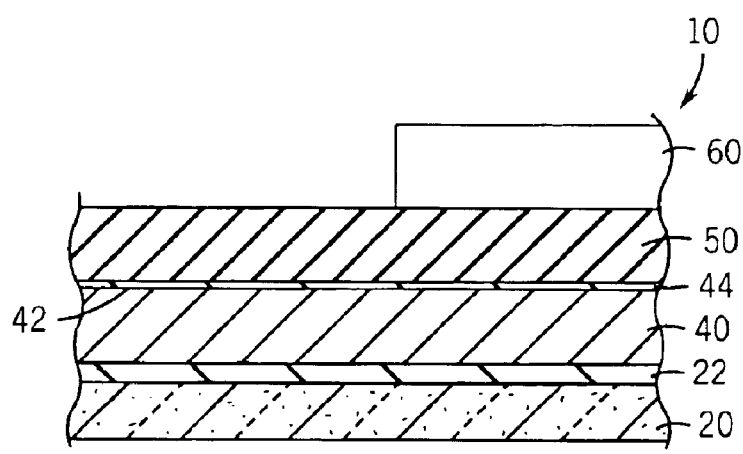
FIG. 2 is a schematic cross-sectional view of the portion shown in FIG. 1 illustrating the formation of a photoresist mask.

In a step 210 illustrated in FIG. 2, a layer 40 of conductive or semiconductive material is provided above or over a layer 22 of dielectric material, which is in turn provided above a wafer 20 (e.g., a single crystal silicon wafer). Layer 40 may be any of a variety of materials suitable for use in a conductive line or gate structure (e.g., metal, polysilicon, polysilicon/germanium ($Si_xGe_{(1-x)}$), etc.) and may be doped or undoped. Layer 22 may be any of a variety of materials suitable for use as a gate dielectric material (e.g., silicon dioxide, silicon nitride, etc.). In an exemplary embodiment, layer 40 is polysilicon and layer 22 is silicon dioxide thermally grown on silicon substrate 20. In an alternative embodiment, layer 40 may include multiple layers of material, one or more of which may include polysilicon.

In an exemplary embodiment, layer 40 has a thickness of between approximately 1,500 and 2,000 angstroms and layer 22 has a thickness of between approximately 200 and 250 angstroms. In an alternative embodiment, layer 40 has a thickness of between approximately 1,000 and 2,500 angstroms and layer 22 has a thickness of between approximately 15 and 25 angstroms. In a first embodiment, layer 22 has a thickness of between approximately 20 and 25 angstroms.. In an alternative embodiment, layer 22 has a thickness of approximately 15 angstroms.

When layer 40 is formed, a thin layer 44 of oxide forms on the top or upper surface 42 of layer 40. Oxide layer 44 may be referred to as a "native" oxide layer. The thickness of oxide layer 44 may vary depending on various processing conditions, and may have a non-uniform thickness. In an exemplary embodiment, oxide layer 44 has a thickness of between approximately 1 and 15 angstroms.

In a step 220, a layer or film 50 of material is deposited above or over layer 40. Layer 50 may be made of any of a variety of materials, including any of a variety of organic materials. In an exemplary embodiment, layer 50 is made of an oxide material (e.g., silicon dioxide, non-stoichiometric silicon-rich oxide, etc.) and has a thickness of between approximately 100 and 150 angstroms. In alternative embodiments, the thickness of layer 50 may differ. For example, the thickness of layer 50 may be less than 100 angstroms (e.g., between approximately 20 and 100 angstroms) or greater than 150 angstroms (e.g., between approximately 150 and 400 angstroms or greater). Additionally, nitride materials (e.g., silicon nitride, silicon-rich nitride, etc.) may be used in place of the oxide material. In further alternative embodiments, layer 50 may include multiple layers of varying compositions.

In a step 230, a layer of photoresist material is deposited above or over layer 50 (e.g., by spin-coating) and exposed to form a photoresist mask 60. The layer of photoresist is deposited at a thickness of between approximately 200 and 400 angstroms. In alternative embodiments, other thicknesses of photoresist material may be used (e.g., thicknesses greater than 400 angstroms, etc.). Any of a variety of photoresist materials may be used, including photoresist materials that may be etched using UV rays having wavelengths of 193 or 248 nanometers. Photoresist mask 60 may be used in the as-patterned state or may be further trimmed to form a smaller photoresist mask. For example, a trim etch may be performed that decreases the size of the photoresist mask in both the horizontal and vertical direction.

Figure 3:
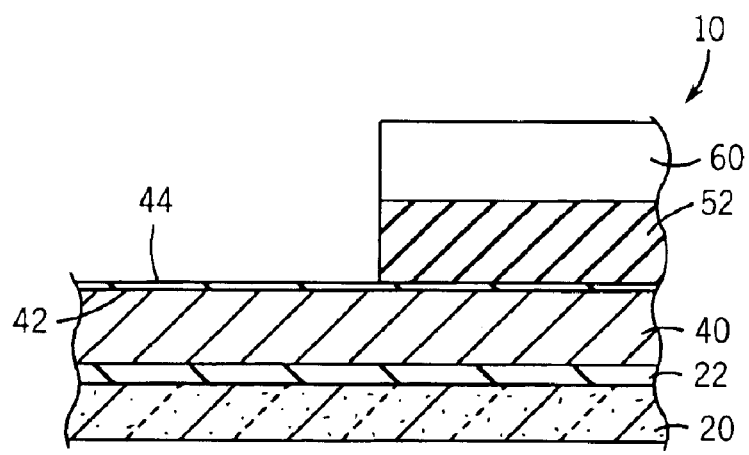
FIG. 3 is a schematic cross-sectional view of the portion shown in FIG. 1 illustrating a patterning step to form a mask definition structure.

In a step 240 shown in FIG. 3, photoresist mask 60 is used as a mask to pattern layer 50 to form a mask definition or support structure or feature 52. In an exemplary embodiment where layer 50 is an oxide material, a portion of layer 50 is removed using a dilute hydrofluoric acid etchant at approximately 25° C. In alternative embodiments where layer 50 is a nitride material, a dilute phosphoric acid may be used as the etchant. Other materials and etchants may be used, as will be recognized by those of skill in the art. For example, a fluorine-based plasma (e.g., $CF_4$, $CF_4/CHF_3$, etc.) may be used in the removal of a silicon oxynitride material layer.

Figure 4:
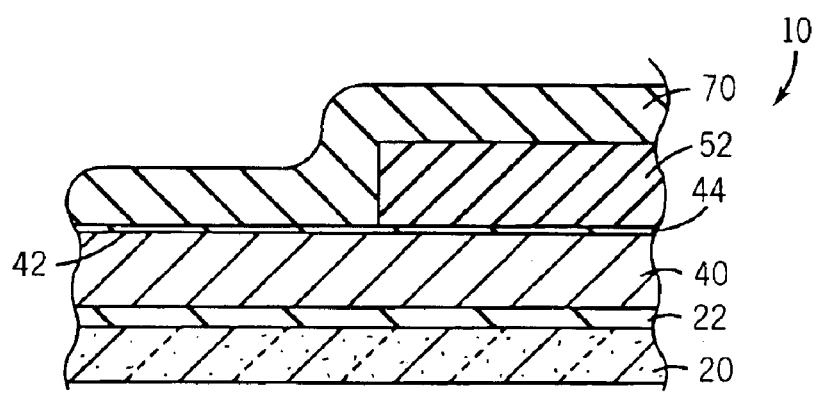
FIG. 4 is a schematic cross-sectional view of the portion shown in FIG. 1 illustrating the deposition of a mask material.

In a step 240 shown in FIG. 4, any remaining photoresist material is removed from the surface of mask definition structure 52. A layer 70 of mask material is then deposited over mask definition structure 52 and layer 40 in a step 250. In an exemplary embodiment, mask material layer 70 comprises amorphous carbon and is deposited in a plasma-enhanced chemical vapor deposition (PECVD) process using a hydrocarbon atmosphere comprising at least one of methane ($CH_4$), ethane ($C_2H_6$), propylene ($C_3H_6$), or other hydrocarbons. The PECVD process is performed at a temperature of between approximately 400° and 550° C. and a pressure of between approximately 5 and 10 torr with a plasma power of between approximately 800 and 1,500 watts.

In a preferred embodiment, layer 70 has a thickness of between approximately 100 and 1000 angstroms. In alternative embodiments, the thickness of layer 70 may vary depending on various design considerations. For example, the layer may have a thickness of less than 100 angstroms (e.g., between 50 and 100 angstroms or less). One advantageous feature of providing an amorphous carbon layer that may be produced with various thicknesses is that the amorphous carbon layer may be produced in a thickness suitable for patterning layer 40. For example, where a particular thickness of polysilicon is provided as layer 40, the thickness of amorphous carbon used to form layer 70 may be altered so that the proper amount of mask material is provided over the polysilicon material to compensate for the etch selectivities of the materials used. This allows for increased manufacturing efficiency by eliminating unnecessary material use.

In a preferred embodiment where amorphous carbon is used to form layer 70, layer 70 is deposited in a pure or undoped form. In an alternative embodiment, the amorphous carbon layer may be deposited with nitrogen incorporated therein. For example, the amorphous carbon layer as deposited may include between approximately 0 and 10 atomic percent nitrogen. To deposit a nitrogen-containing amorphous carbon layer, a PECVD process using an atmosphere of propylene ($C_3H_6$) and nitrogen is used. To achieve a doping concentration of approximately 6 atomic percent nitrogen, for example, a flow ratio approximately 1:10 is used for the propylene to nitrogen gas flow rate (e.g., 300 cubic centimeters of propylene per minute to 3 liters of nitrogen per minute). In alternative embodiments, various other nitrogen concentrations may be achieved by varying the various processing conditions (e.g., increasing or decreasing the gas flow ratio of propylene to nitrogen, etc.).

In another alternative embodiment, an inert ion species may be implanted or introduced into the amorphous carbon layer. In this embodiment, the inert ions may be implanted at an energy between approximately 5 and 15 keV to a concentration of between approximately 0.1 and 1.0 atomic percent. The implantation of ions into the amorphous carbon layer may be performed in both nitrogen-doped and undoped amorphous carbon layers. Any of a variety of inertions may be introduced or implanted into the amorphous carbon layer, including helium (He), argon (Ar), neon (Ne), krypton (Kr), xenon (Xe), and radon (Rn). Additionally, more than one inert ion species may be introduced into the amorphous carbon layer. For example, both helium and xenon ions may be implanted into the amorphous carbon layer. Other combinations are possible in alternative embodiments.

In another alternative embodiment, only a portion of the amorphous carbon layer is doped with nitrogen and/or inertion species. For example, a top portion of the amorphous carbon layer may be doped, while a bottom portion of the amorphous carbon layer may comprise pure or undoped amorphous carbon. In another example, the amorphous carbon layer may include alternating layers of doped and undoped amorphous carbon material.

One advantageous feature of doping the amorphous carbon layer with nitrogen and/or inertions is that the doping may act to relieve or reduce the internal stress of the amorphous carbon layer. For example, where the internal stress of the amorphous carbon layer is generally compressive, the introduction of nitrogen or inertions may reduce the compressive stress or change the internal stress to tensile stress. By altering the stress profile of the amorphous carbon layer, better shape integrity of patterns formed in the amorphous carbon layer, and hence in the underlying material layer, may be obtained. For example, where the amorphous carbon layer is patterned to form a mask for creating a conductive line in an underlying material layer, reduced or altered internal stresses in the amorphous carbon mask may allow the mask to better retain its shape during processing, thus allowing the formation of conductive lines that do not exhibit warpage or wiggle characteristics.

While layer 70 has been described as comprising an amorphous carbon material and mask definition structure 52 has been described as being formed of any of a variety of other materials (e.g., silicon dioxide, silicon nitride, silicon-rich oxide or nitride, etc.), it should be noted that the material compositions of layer 70 and structure 52 may be reversed. Thus, in an alternative embodiment, mask definition structure 52 may comprise doped or undoped amorphous carbon. To form such a mask definition structure, an additional layer of material is provided over layer 50 that comprises an anti-reflective coating (ARC) material (e.g., silicon nitride, silicon oxynitride, silicon-rich oxide, silicon-rich nitride, and the like). The ARC layer has a deposited thickness of between approximately 200 and 250 angstroms, and acts to protect the underlying amorphous carbon layer during deposition and exposure of the photoresist material and to prevent reflection of ultraviolet (UV) rays used in the exposure of the photoresist material. In this embodiment, the ARC layer is patterned using the photoresist mask and itself is used as a mask to form the amorphous carbon mask definition structure. The ARC layer may then be removed using hydrofluoric acid or a fluorine-based plasma.

Figure 5:
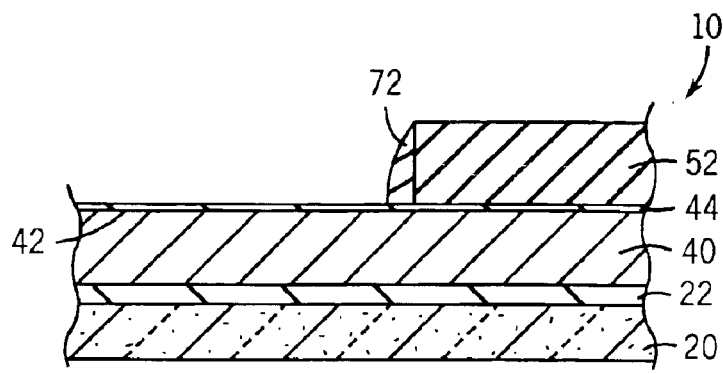
FIG. 5 is a schematic cross-sectional view of the portion shown in FIG. 1 illustrating the removal of a portion of the mask material to form a mask feature.
Figure 6:
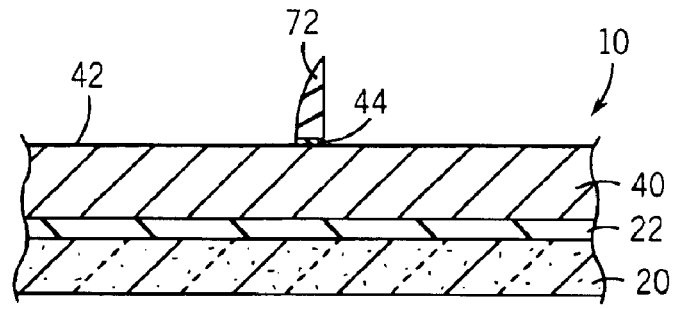
FIG. 6 is a schematic cross-sectional view of the portion shown in FIG. 1 illustrating the removal of the mask definition structure.

FIGS. 5–6 will be described with reference to the preferred embodiment described above, in which layer 70 comprises undoped amorphous carbon and layer 52 comprises an oxide material. In a step 260 shown in FIG. 5, a portion of layer 70 is removed to form a mask feature or mask 72. In an exemplary embodiment, layer 70 is etched using an oxygen-based plasma at a temperature of between approximately 40° and 60° C. and a pressure of between approximately 3 and 10 millitorr. For example, the plasma used may be an oxygen-hydrogen-bromide plasma, an oxygen-nitrogen plasma, an oxygen-$CHF_3$ plasma, and the like. Argon may also be present in the atmosphere. The plasma power may be adjusted so that the ion density power is between approximately 800 and 1,200 watts and the ion energy control is between approximately 50 and 200 watts.

As shown in FIG. 5, mask feature 72 is formed in the shape of a spacer constrained on one side by mask definition structure 52. One advantageous feature of this arrangement is that mask definition structure 52 acts to form a generally straight or linear edge for mask feature 72 and constrains the material used to form mask feature 72 form deforming. In this manner, at least a portion of mask feature 72 is defined by mask definition structure 52.

In an exemplary embodiment, mask feature 72 has a width of between approximately 30 and 50 nanometers and a height of between approximately 25 and 40 nanometers. In an alternative embodiment, mask feature 72 may be overetched to form a mask feature having smaller dimensions (e.g., a width of between approximately 10 and 30 nanometers and a height of between approximately 15 and 25 nanometers). The overetch processing conditions may be similar to those used to form mask feature 72. Overetching of mask feature 72 may be performed before or after removal of mask definition structure 52.

One advantageous feature of using the plasma etch method described above is that mask feature 72 is formed without the use of aqueous etchants that may damage or destroy mask 72 as processing proceeds. For example, the use of phosphoric acid as an etchant is eliminated by using a mask layer of amorphous carbon, since portions of the amorphous carbon layer may be removed using a plasma etch. Further, by forming mask feature 72 in contact with (e.g., in abutting relation to) a portion of mask definition feature 52, mask feature 72 does not collapse upon removal of a portion of layer 70, thus allowing a mask having very small dimensions to be produced.

In a step 270 shown in FIG. 6, mask definition structure 52 is removed to leave mask structure 72 above layer 40. Mask definition structure 52 may be removed using any etchant and processing conditions desirable for the particular material used to form the mask definition structure (e.g., a dilute hydrofluoric acid etch where an oxide material is used, etc.). A breakthrough etch (not shown) to remove oxide layer 44 from the surface 42 of layer 40 may also be performed at this time, according to any conventional breakthrough etch method.

With mask definition structure 52 removed, mask feature 72 is used as a mask to form features in layer 40 in a step 280. For example, in an exemplary embodiment where layer 40 comprises polysilicon, layer 40 may be etched according to mask feature 72 to form conductive line 30 (FIG. 1). The polysilicon etch is performed using HBr and $Cl_2$ at a temperature of between approximately 40 and 70° C. and a pressure of between approximately 2 and 7 mTorr.

In a step 290, mask structure 72 and any remaining native oxide are removed after layer 40 is patterned (e.g., to form conductive line 30 shown in FIG. 1). Mask structure 72 may be removed using a method similar to that described above, in which an oxygen-containing plasma may be used to remove or "ash" away the amorphous carbon mask to expose the top surface of conductive line 30. In subsequent processing steps, other material layers and devices may be added to portion 10 to form a complete integrated circuit.

Figure 12:
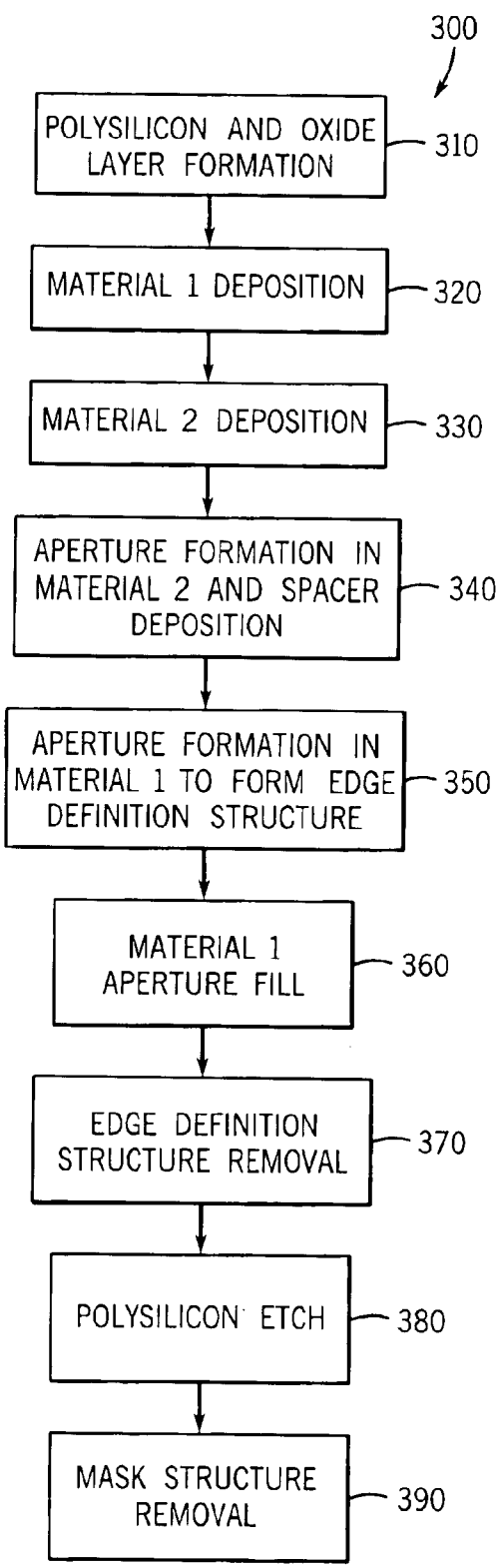
FIG. 12 is a flow diagram illustrating the process of forming structures in an integrated circuit according to the alternative embodiment shown in FIGS. 7–10.

While mask structure 72 is described above as being constrained on one side by mask definition structure 52, in an alternative embodiment, a mask structure may be formed that is more fully constrained by an adjacent mask definition structure. A method of forming features in an integrated circuit, such as a conductive line as shown in FIG. 1, will now be described with reference to FIGS. 7–10. FIG. 12 is a flow diagram that outlines a process 300 used in the formation of such features.

Figure 7:
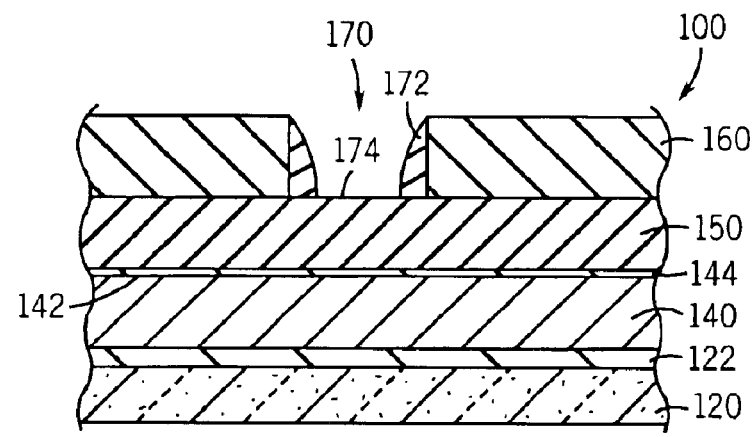
FIG. 7 is a schematic cross-sectional view of a portion of an integrated circuit according to an alternative embodiment illustrating the formation of a mask.

FIG. 7 illustrates a number of steps in the formation of features in a portion 100 of an integrated circuit. In a step 310, a layer 140 comprising conductive or semiconductive material (e.g., polysilicon, etc.) is formed above a layer of oxide 122 and a substrate 120 using methods similar to those described above with regard to layers 40, 22, and 20. Additionally, a thin layer of native oxide 144 may be formed on a surface 142 of layer 140.

In a step 320, a first layer 150 of material ("material 1") is deposited above layer 140. Layer 150 is used subsequently to form a mask definition structure 152. In an exemplary embodiment, layer 150 comprises an oxide material and has a thickness of between approximately 400 and 600 angstroms.

In a step 330, a second layer 160 of material ("material 2") is deposited above layer 150. In an exemplary embodiment, layer 160 is formed of a nitride material and has a thickness of between approximately 500 and 800 angstroms. While layers 150 and 160 have been described as being made of particular materials, other materials may also be used to form these layers. For example, layer 150 may comprise a nitride material and layer 160 may comprise an oxide material.

In a step 340, an aperture or hole 170 is formed in layer 160 using any of a variety of conventional techniques. For example, aperture 170 may be formed by using a photoresist mask deposited above layer 160 and patterned such that aperture 170 may be formed in a subsequent etching step. Alternatively, any of a variety of wet or dry etching techniques may be used. In an exemplary embodiment, aperture 170 has a width of between approximately 50 and 70 nanometers.

Spacers 172 are formed within aperture 170 to further narrow the width of aperture 170. Spacers 172 may be formed using any conventional method, such as by filling aperture 170 with a spacer material and etching the spacer material to form spacers. With spacers 172 formed within aperture 170, the width of aperture 170 at the bottom 174 of the aperture is between approximately 10 and 40 nanometers. In an alternative embodiment, spacers are not provided within aperture 170.

In an exemplary embodiment, spacers 172 comprise a material similar or identical to that used to form layer 160 (e.g., a nitride material where a nitride material is used to form layer 160). In an alternative embodiment, the spacers may be formed from a material that is different from that used to form layer 160 (e.g., the spacers may be formed of an oxide material or a different nitride material where layer 160 is formed from a particular nitride material).

Figure 8:
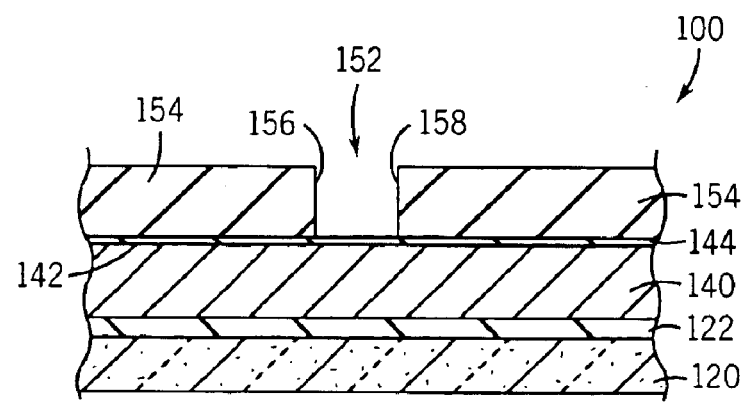
FIG. 8 is a schematic cross-sectional view of the portion shown in FIG. 7 illustrating the formation of an aperture in a layer of material to form a mask definition structure.

In a step 350 shown in FIG. 8, an aperture 152 is formed in layer 150 using layer 160 and spacers 172 as a mask.

Aperture 152 may be formed using conventional etching techniques. For example, where layer 150 is formed of an oxide material, a hydrofluoric acid etch may be used. In an exemplary embodiment, the width of aperture 152 is between approximately 10 and 40 nanometers. Aperture 152 may have the same or a smaller width than the bottom portion 174 of aperture 170 defined by spacers 172. Aperture 152 divides layer 150 to form a mask definition structures 154 similar to mask definition structure 52 described above. Whereas mask definition structure 52 acts to constrain mask feature 72 on only one side of mask feature 72, mask definition structure 154 may act to constrain a mask formed within aperture 152 on two or more sides. Thus, lateral walls 156, 158 may act to provide support or definition to a mask formed within aperture 152.

Figure 9:
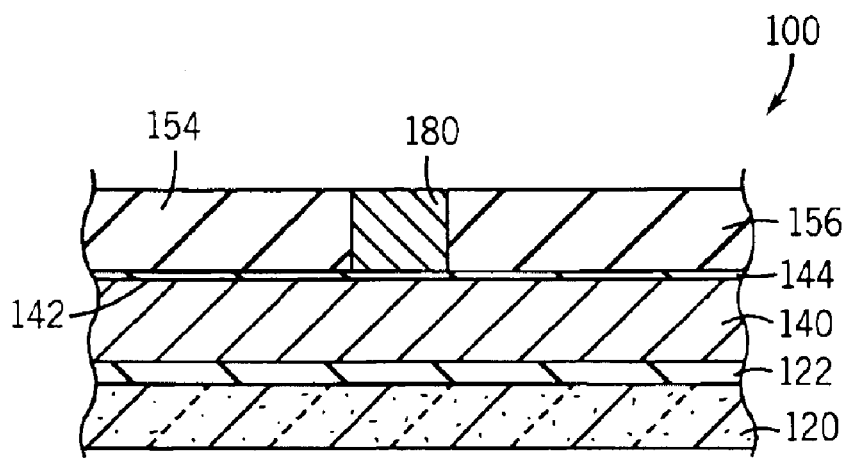
FIG. 9 is a schematic cross-sectional view of the portion shown in FIG. 7 illustrating a material deposition step in which the aperture shown in FIG. 8 is filled.

In a step 360 shown in FIG. 9, aperture 152 is filled with a material to form a mask structure 180. To form mask structure 180, a layer of material is deposited within aperture 152 and over the entire portion 100, after which the material is etched using a chemical mechanical polish (CMP) or other method to planarize mask definition structure 154 and mask structure 180. In an exemplary embodiment, mask structure 180 comprises undoped amorphous carbon. In alternative embodiments, mask structure 180 may comprise amorphous carbon that is doped with any of a variety of ions as described above.

Figure 10:
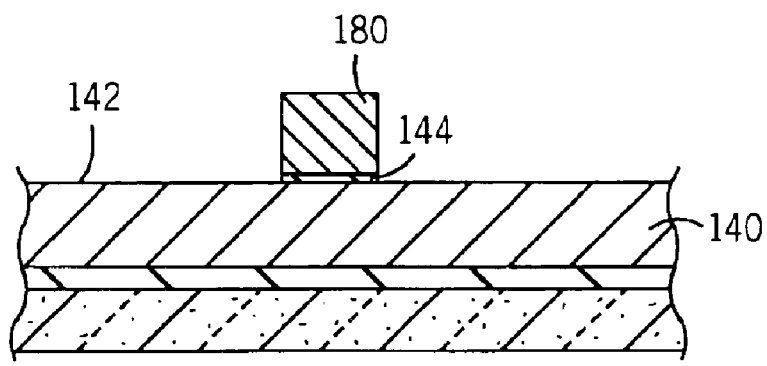
FIG. 10 is a schematic cross-sectional view of the portion shown in FIG. 7 illustrating the removal of the mask definition structure.

In a step 370 shown in FIG. 10, mask definition structure 154 is removed in a manner similar to mask definition structure 52, leaving mask structure 180 as an etch mask for the underlying layer 140. Oxide layer 144 may also be removed at this time. While mask structure 180 is illustrated in FIG. 10 as having a shape similar to that of aperture 152 in which it was originally formed, mask structure 180 may be further etched to reduce its size and/or shape. For example, an oxygen-based plasma etch may be used to further reduce the width of mask structure 180 and/or to round the top of mask structure 180.

In a step 380, layer 140 is etched to form a feature therein using mask structure 180 as a mask, similar to the method described above with regard to etch mask 72. A feature (e.g., a conductive line, etc.) similar to conductive line 30 (FIG. 1) may be formed in this manner. In a step 390, mask structure 180 is removed using an oxygen-based plasma. Any remaining oxide layer 144 may also be removed at this time. In subsequent processing steps, other material layers and devices may be added to portion 100 to form a complete integrated circuit.

While the exemplary embodiments illustrated in the FIGURES and described above are presently preferred, it should be understood that these embodiments are offered by way of example only. Other embodiments may include, for example, different methods of depositing the various layers above the substrate, different combination of times, temperatures, pressures, and the like. Further, although a two layer gate stack is shown, a flash gate stack or other multilayer structure can be patterned without departing from the scope of the claims. The invention is not limited to a particular embodiment, but extends to various modifications, combinations, and permutations that nevertheless fall within the spirit and scope of the appended claims.

What is claimed is:

1. A method of producing an integrated circuit comprising:
    providing a mask definition structure above a layer of conductive material, the mask definition structure comprising a first material;
    providing a mask above the layer of conductive material and in contact with at least a portion of the mask definition structure, the mask comprising a second material;
    removing the mask definition structure; and
    patterning the layer of conductive material according to the mask;
    wherein at least one of the first and second materials comprises amorphous carbon doped with a third material selected from the group consisting of nitrogen, helium, argon, krypton, radon, neon, and xenon.

2. The method of claim 1, wherein the step of providing a mask definition structure comprises depositing a layer of the first material and removing at least a portion of the layer of first material.

3. The method of claim 2, wherein the step of removing at least a portion of the layer of first material comprises depositing a layer of a third material over the layer of first material and patterning the layer of third material.

4. The method of claim 3, wherein the step of patterning the layer of third material comprises forming an aperture in the layer of third material and forming at least one spacer within the aperture.

5. The method of claim 4, wherein the third material is different from the first material and at least one of the first and third materials comprise at least one of an oxide and a nitride material.

6. The method of claim 1, wherein the step of providing a mask comprises depositing a layer of the second material and removing a portion of the layer of second material.

7. The method of claim 1, further comprising removing at least a portion of the mask after the step of removing the mask definition structure and before the step of patterning the layer of conductive material.

8. A method of producing an integrated circuit comprising:
    providing a mask definition structure above a layer of conductive material, the mask definition structure comprising a first material;
    providing a mask above the layer of conductive material and in contact with at least a portion of the mask definition structure, the mask comprising a second material;
    removing the mask definition structure; and
    patterning the layer of conductive material according to the mask;
    wherein at least one of the first and second materials comprises amorphous carbon; and
    wherein at least one of the first and second materials comprises amorphous carbon doped with at least one of nitrogen, helium, argon, krypton, radon, neon, and xenon.

9. The method of claim 1, wherein the mask comprises amorphous carbon, and further comprising removing the mask using an oxygen-based plasma.

10. The method of claim 1, wherein the step of patterning the layer of conductive material comprises forming a conductive line having a width of less than approximately 50 nanometers.

11. A method of forming features in an integrated circuit comprising:
    forming a mask support structure above a layer of polysilicon;
    depositing mask material adjacent to the mask support structure;

removing a portion of the mask material to form a mask, the mask abutting a portion of the mask support structure;

removing the mask support structure; and etching the layer of polysilicon according to the mask;

wherein one of the mask support structure and the mask comprises amorphous carbon; and implanting the amorphous carbon with at least one material selected from the group consisting of nitrogen, helium, argon, krypton, radon, neon, and xenon.

12. The method of claim 11, wherein the step of forming a mask support structure comprises forming an aperture in a layer of material and the step of depositing mask material comprises filling the aperture with mask material.

13. The method of claim 11, wherein the step of forming a mask support structure comprises depositing a layer of material and removing a portion of the layer of material.

14. The method of claim 11, wherein the mask material comprises amorphous carbon.

15. A method of forming features in an integrated circuit comprising:

forming a mask support structure above a layer of polysilicon;

depositing mask material adjacent to the mask support structure;

removing a portion of the mask material to form a mask, the mask abutting a portion of the mask support structure;

removing the mask support structure; and etching the layer of polysilicon according to the mask;

wherein the mask comprises amorphous carbon; and wherein the mask material further comprises at least one of nitrogen, helium, argon, krypton, radon, neon, and xenon.

16. A method of forming features in an integrated circuit comprising:

forming a mask support structure above a layer of polysilicon;

depositing mask material adjacent to the mask support structure;

removing a portion of the mask material to form a mask, the mask abutting a portion of the mask support structure;

removing the mask support structure; and etching the layer of polysilicon according to the mask;

wherein the mask support structure comprises amorphous carbon and the step of forming the mask support structure comprises depositing a layer of anti-reflective coating (ARC) material over an amorphous carbon layer and patterning the layer of ARC material.

17. The method of claim 11, wherein the mask has a width of between approximately 30 and 50 nanometers.

18. An integrated circuit produced by a method comprising:

providing a first layer of material over a layer of conductive material;

removing a portion of the first layer of material to form a mask definition feature;

providing a second layer of material over the layer of conductive material and adjacent to at least a portion of the mask definition feature;

removing a portion of the second layer of material to form a mask, wherein at least a portion of the mask is defined by the mask definition feature;

removing the mask definition feature; and forming a feature in the layer of conductive material according to the mask;

wherein one of the first layer of material arid the second layer of material comprises amorphous carbon doped with a material configured to reduce stresses in the amorphous carbon, wherein the material configured to reduce stresses in the amorphous carbon comprises at least one material selected from the group consisting of nitrogen, helium, argon, krypton, radon, neon, and xenon.

19. The integrated circuit of claim 18, wherein the mask comprises amorphous carbon and the step of removing a portion of the second layer comprises etching the second layer with an oxygen-based plasma.

20. The integrated circuit of claim 18, wherein the feature formed in the layer of conductive material has a width of between approximately 30 and 50 nanometers.

21. A method of producing an integrated circuit comprising:

providing a mask definition structure above a layer of conductive material, the mask definition structure a first material;

providing a mask above the layer of conductive material and in contact with at least a portion of the mask definition structure, the mask comprising a second material;

removing the mask definition structure; and patterning the layer of conductive material according to the mask;

wherein at least one of the first and second materials comprises amorphous carbon doped with a third material;

wherein the first material is doped with the third material, the third material comprising nitrogen.

22. A method of producing an integrated circuit comprising:

providing a mask definition structure above a layer of conductive material, the mask definition structure comprising a first material;

providing a mask above the layer of conductive material and in contact with at least a portion of the mask definition structure, the mask comprising a second material;

removing the mask definition structure; and patterning the layer of conductive material according to the mask;

wherein at least one of the first and second materials comprises amorphous carbon doped with a third material;

wherein the second material is doped with the third material, the third material comprising nitrogen.

23. A method of producing an integrated circuit comprising:

providing a mask definition structure above a layer of conductive material, the mask definition structure comprising a first material;

providing a mask above the layer of conductive material and in contact with at least a portion of the mask definition structure, the mask comprising a second material;

removing the mask definition structure; and patterning the layer of conductive material according to the mask;

wherein at least one of the first and second materials comprises amorphous carbon doped with a third material;

wherein the first material is doped with the third material, the third material comprises a material selected from the group consisting of helium, argon, krypton, radon, neon, and xenon.

24. A method of producing an integrated circuit comprising;

providing a mask definition structure above a layer of conductive material, the mask definition structure comprising a first material;

providing a mask above the layer of conductive material and in contact with at least a portion of the mask definition structure, the mask comprising a second material;

removing the mask definition structure; and patterning the layer of conductive material according to the mask;

wherein at least one of the first and second materials comprises amorphous carbon doped with a third material;

wherein the second material is doped with the third material, the third material comprising a material selected from the group consisting of helium, argon, krypton, radon, neon, and xenon.

25. An integrated circuit produced by a method comprising:

providing a first layer of material over a layer of conductive material;

removing a portion of the first layer of material to form a mask definition feature;

providing a second layer of material over the layer of conductive material and adjacent to at least a portion of the mask definition feature;

removing a portion of the second layer of material to form a mask wherein at least a portion of the mask is defined by the mask definition feature;

removing the mask definition feature; and forming a feature in the layer of conductive material according to the mask;

wherein one of the first layer of material and the second layer of material comprises amorphous carbon doped with a material configured to reduce stresses in the amorphous carbon;

wherein the material configured to reduce stresses in the amorphous carbon comprises nitrogen.

26. An integrated circuit produced by a method comprising;

providing a first layer of material over a layer of conductive material;

removing a portion of the first layer of material to form a mask definition feature;

providing a second layer of material over the layer of conductive material and adjacent to at least a portion of the mask definition feature;

removing a portion of the second layer of material to form a mask, wherein at least a portion of the mask is defined by the mask definition feature;

removing the mask definition feature; and forming a feature in the layer of conductive material according to the mask;

wherein one of the first layer of material and the second layer of material comprises amorphous carbon doped with a material configured to reduce stresses in the amorphous carbon;

wherein the material configured to reduce stresses in the amorphous carbon comprises a material selected from the group consisting of helium, argon, krypton, radon, neon, and xenon.

* * * * *

UNITED STATES PATENT AND TRADEMARK OFFICE
CERTIFICATE OF CORRECTION

PATENT NO. : 7,015,124 B1
DATED : March 21, 2006
INVENTOR(S) : Philip A. Fisher, Richard J. Huang and Cyrus E. Tabery It is certified that error appears in the above-identified patent and that said Letters Patent is hereby corrected as shown below:

<u>Column 12,</u>
Line 4, replace "arid" with -- and --.
Line 23, after "structure" insert -- comprising --.

Signed and Sealed this

Sixth Day of June, 2006

JON W. DUDAS
*Director of the United States Patent and Trademark Office*